(12) United States Patent
Zhao et al.

(10) Patent No.: US 6,396,309 B1
(45) Date of Patent: May 28, 2002

(54) CLOCKED SENSE AMPLIFIER FLIP FLOP WITH KEEPERS TO PREVENT FLOATING NODES

(75) Inventors: Cangsang Zhao, Hillsboro; Chi-Yeu Chao; Gregory F. Taylor, both of Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/824,601

(22) Filed: Apr. 2, 2001

(51) Int. Cl.$^7$ ................................................ G11C 7/06
(52) U.S. Cl. ........................................ 327/55; 327/57
(58) Field of Search ............................ 327/55–57, 200, 327/201, 211, 212

(56) References Cited

U.S. PATENT DOCUMENTS 6,191,620 B1 * 2/2001 Lattimore et al. ............ 327/55
6,215,713 B1 * 4/2001 Austin ........................... 327/51
6,252,429 B1 * 6/2001 Assaderaghi et al. ......... 327/55
6,271,687 B1 * 8/2001 Toyoshima et al. ........... 327/55
6,310,501 B1 * 10/2001 Yamashita ................... 327/211
6,331,791 B1 * 12/2001 Huang .......................... 327/55

OTHER PUBLICATIONS

Matsui, M., et al., "A 200 MHz 13 mm$^2$ 2–D DCT Macrocell Using Sense–Amplifying Pipeline Flip–Flop Scheme", *IEEE Journal of Solid–State Circuits*, 29 (12), pp. 1482–1490, (Dec. 1994).

* cited by examiner

Primary Examiner—Toan Tran
(74) Attorney, Agent, or Firm—Schwegman, Lundberg, Woessner & Kluth, P.A.

(57) ABSTRACT

A clocked sense amplifier flip flop includes at least one keeper unit to prevent the occurrence of a floating data node.

20 Claims, 5 Drawing Sheets

CLOCKED SENSE AMPLIFIER FLIP FLOP WITH KEEPERS TO PREVENT FLOATING NODES

FIELD OF THE INVENTION

The invention relates generally to sequential digital circuits and, more particularly, to clocked flip flop circuits.

BACKGROUND OF THE INVENTION

Digital data processing systems (e.g., computer systems) commonly employ bus structures to provide data communication between functional units within the system. For example, a computer will generally include a front-side bus to provide communication between the main processor and the chip set of the computer. The bus will typically include a data transmission medium that extends between two (or more) functional units. The bus can also include a transmission medium for carrying a clock signal between the units (such as in systems using source synchronous timing). A driver within one of the functional units is used to transmit a data signal onto the data transmission medium toward the other functional unit. A receiver within the other functional unit receives the data signal from the transmission medium, detects the data within the signal (e.g., using the associated clock signal), and temporarily stores the detected data. The data can then be used by processing functionality within the second functional unit. The speed with which the receiver can receive data from the transmission medium (i.e., the setup and hold time of the receiver) will typically dictate the maximum speed of the bus. It is generally desirable that data busses operate as quickly as possible, so receivers having low setup and hold times are desired. As a significant amount of noise may be present in the vicinity of a data processing system, it is also generally desirable that bus receivers operate in a relatively robust manner in the face of such noise.

DETAILED DESCRIPTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a clocked sense amplifier flip flop that can be used as a bus receiver within, for example, a digital processing device. The clocked sense amplifier flip flop is capable of relatively low setup and hold times compared to prior art bus receiver designs that utilize static sense amplifiers. Thus, the clocked sense amplifier flip flop can be used to support high speed bus operation. In addition, the clocked sense amplifier flip flop only uses power during the switching process and thus consumes less power than static sense amplifier based designs that continuously drain DC current during circuit operation. In at least one embodiment, one or more keeper units are added to the clocked sense amplifier flip flop to improve circuit robustness. The keeper units are used to prevent the occurrence of floating nodes within the device that could otherwise cause data errors when noise is present within the system.

Figure 1:
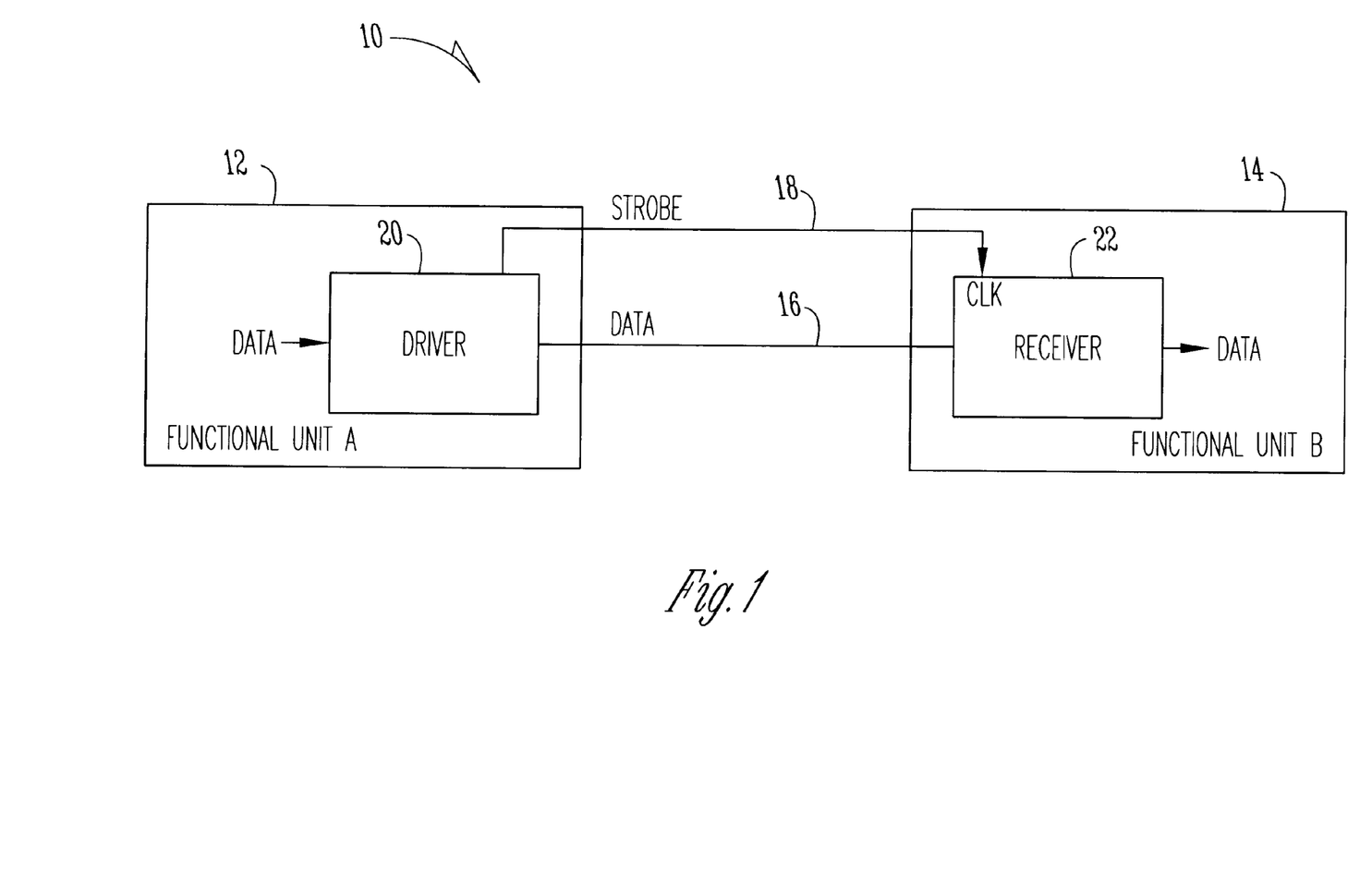
FIG. 1 is a block diagram illustrating a source synchronous bus arrangement that can be implemented within a digital data processing system to provide data communication between two functional units.

FIG. 1 is a block diagram illustrating a source synchronous bus arrangement 10 that can be implemented within a digital data processing system to provide data communication between two functional units (e.g., a processor and a chipset) within the system. As used herein, the term "functional unit" refers to any device, component, or subsystem within a digital data processing system that performs a data manipulation, storage, or generation function. With reference to FIG. 1, a first functional unit 12 (FUNCTIONAL UNIT A) transmits data to a second functional unit 14 (FUNCTIONAL UNIT B) via a data transmission medium 16 between the units. A strobe medium 18 (STROBE) is also provided to carry a clock signal from the first functional unit 12 to the second functional unit 14 that is synchronized with the data signal. When data is to be transferred between the functional units 12, 14, a driver 20 within the first functional unit 12 transmits a data signal and an associated clock signal onto the corresponding media 16, 18. A receiver 22 within the second functional unit 14 receives the data and clock signals at corresponding inputs thereof. The receiver 22 then uses the received clock information to detect and possibly amplify the data within the received data signal. The detected data is then delivered to a processing core within the second functional unit 14. A similar arrangement can be used to transfer data in the opposite direction. Such bus systems typically utilize well known Gunning Transceiver Logic (GTL) techniques to effect data transmission on the various media. It should be appreciated, however, that the present invention is not limited to implementation within either source synchronous or GTL based systems.

Figure 2:
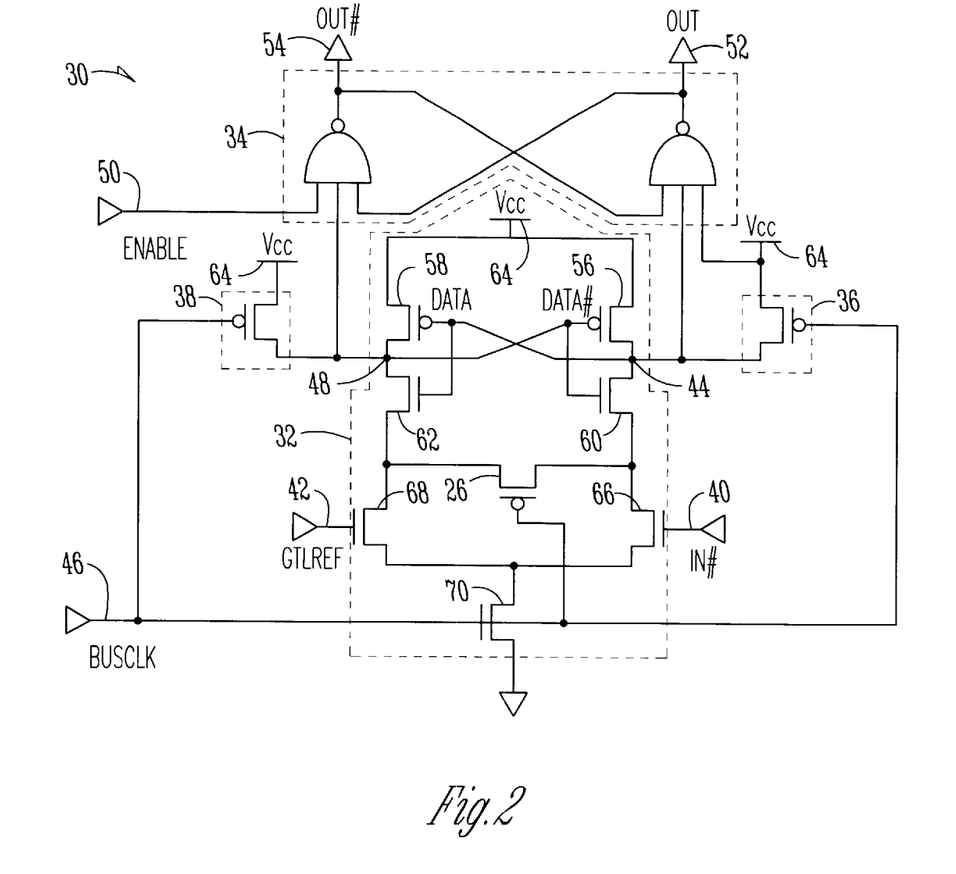
FIG. 2 is a schematic diagram illustrating a clocked sense amplifier flip flop that is used as a bus receiver in accordance with one embodiment of the present invention.

FIG. 2 is a schematic diagram illustrating a clocked sense amplifier flip flop 30 that is used as a bus receiver in accordance with one embodiment of the present invention. The clocked sense amplifier flip flop 30 can be used, for example, as the receiver 22 within the second functional unit 14 of FIG. 1 and is particularly well suited for use in conjunction with a GTL-based bus system. As illustrated, the clocked sense amplifier flip flop 30 includes a sense amplifier 32, an output latch 34, and a pair of precharge units 36, 38. The clocked sense amplifier flip flop 30 also includes a clock line 46 for receiving a clock signal (BUSCLK) from a corresponding medium (e.g., strobe medium 18 of FIG. 1). The sense amplifier 32 includes a data input 40 (IN#) to receive a data signal from a corresponding data medium (e.g., transmission medium 16 of FIG. 1). The sense amplifier 32 also includes a reference input 42 to receive a reference signal (GTLREF) to be compared to the data signal received at data input 40 as part of the signal detection process. The reference signal (GTLREF) will typically be a constant voltage signal having a magnitude somewhere between (e.g., halfway between) the nominal magnitude representative of a logic zero and the nominal magnitude representative of a logic one in the system. The sense amplifier 32 further includes a pair of complementary data nodes 44, 48 (DATA and DATA#) to carry the data bit sensed by the sense amplifier 32 for transfer to the output latch 34. The output latch 34 latches the data bit on the complementary data nodes 44, 48 into its internal storage location (i.e., a 1-bit storage cell) in response to an enable signal (ENABLE) received at an enable input 50. The latched data bit is thus made available at first and second complementary output terminals 52, 54 (OUT, OUT#) to other circuitry within the corresponding functional unit.

As illustrated in FIG. 2, the sense amplifier 32 includes first and second P-channel metal-oxide-semiconductor field effect transistors (i.e., P-channel MOSFETs or PMOS transistors) 56, 58 and first and second N-channel metal-oxide-semiconductor field effect transistors (i.e., N-channel MOSFETs or NMOS transistors) 60, 62. The first and second PMOS devices 56, 58 are preferably matched devices. Similarly, the first and second NMOS devices 60, 62 are preferably matched devices. One drain/source terminal of each of the first and second PMOS transistors 56, 58 is connected to a supply terminal 64 ($V_{CC}$). The other drain/source terminal of each of the first and second PMOS transistors 56, 58 is connected to a corresponding one of the complementary data nodes 44, 48. Likewise, one of the drain/source terminals of each of the first and second NMOS transistors 60, 62 is connected to a corresponding one of the complementary data nodes 44, 48. The gate terminals of the first PMOS transistor 56 and the first NMOS transistor 60 are each conductively coupled to the second complementary data node 48 using appropriate wiring. Similarly, the gate terminals of the second PMOS transistor 58 and the second NMOS transistor 62 are each conductively coupled to the first complementary data node 44 using appropriate wiring.

The sense amplifier 32 further includes an input transistor 66 and a reference transistor 68. In the illustrated embodiment, the input transistor 66 and the reference transistor 68 are each NMOS devices. As shown, one drain/source terminal of the input transistor 66 is connected to a corresponding drain/source terminal of the first NMOS transistor 60 and one drain/source terminal of the reference transistor 68 is connected to a corresponding drain/source terminal of the second NMOS transistor 62. The other drain/source terminals of the input and reference transistors 66, 68 are connected to a pull down transistor 70 that controllably couples these terminals to ground in response to the clock signal (BUSCLK) on clock line 46.

The precharge units 36, 38 are operative for precharging the first and second complementary data nodes 44, 48 in response to the clock signal. In the illustrated embodiment, the precharge units 36, 38 each include a single PMOS transistor that receives the clock signal at a gate terminal thereof. The precharge transistors couple the corresponding data nodes 44, 48 to the supply terminal 64 when the clock signal (BUSCLK) has a logic low value, thus precharging the nodes. When the clock signal subsequently goes high, the precharge transistors are turned off. A shunt transistor 26 is connected between the lower drain/source terminal of the first NMOS transistor 60 and the lower drain/source terminal of the second NMOS transistor 62. The shunt transistor 26 is a PMOS device that turns on when the clock signal (BUSCLK) is logic low (i.e., during the precharge period). The function of the shunt transistor 26 is to equalize the potentials on the source terminals of the first and second NMOS transistors 60, 62 to ensure sensing accuracy.

The operation of the clocked sense amplifier flip flop 30 will now be described. As described above, when BUSCLK is logic low, the precharge units 36, 38 charge up the first and second complementary data nodes 44, 48. During this period, the pull down transistor 70 is turned off and no current flows down through the sense amplifier 32. Also during this period, a new input data bit is received from the bus at data input 40. If the new data bit is logic one, the voltage on the data input 40 will be greater than the voltage on the reference input 42. Conversely, if the new data bit is logic zero, the voltage on the data input 40 will be less than the voltage on the reference input 42. When the clock signal transitions to logic high, the precharge units 36, 38 turn off and the pull down transistor 70 turns on, allowing current to flow through the sense amplifier 32. Because the complementary data nodes 44, 48 are each initially fully charged, the first and second PMOS transistors 56, 58 are off and the first and second NMOS transistors 60, 62 are on. Therefore, the first and second complementary data nodes 44, 48 will begin to discharge through the input transistor 66 and the reference transistor 68, respectively. However, because the gate voltages are different on the input transistor 66 and the reference transistor 68, these devices will be conducting different levels of current. Consequently, one of the complementary data nodes 44, 48 will discharge (and thus drop in voltage) faster than the other. As described previously, each of the complementary data nodes 44, 48 is connected to the gate terminals of one of the PMOS transistors 56, 58 and one of the NMOS transistors 60, 62. Therefore, as the voltage drops on the data node that is discharging faster, the corresponding PMOS transistor begins to turn on and the corresponding NMOS transistor begins to turn off. As the NMOS transistor turns off, the discharge rate of the other data node 48, 44 (i.e., the one that is discharging slower) reduces even further. At the same time, the PMOS transistor that is turning on begins to couple this other data node 48, 44 to the supply terminal 64. Eventually, a state is achieved where one of the complementary data nodes 44, 48 is logic high and the other is logic low. In the illustrated embodiment, when the input signal (IN#) on the data input 40 is logic high (i.e., the magnitude of the corresponding voltage is greater than the magnitude of GTLREF), the DATA node 44 discharges faster than the DATA# node 48, resulting in a logic low voltage on the DATA node 44 and a logic high voltage on the DATA# node 48. Similarly, when the input signal (IN#) is logic low (i.e., the magnitude of the corresponding voltage is less than the magnitude of GTLREF), the DATA# node 48 discharges faster than the DATA node 44, resulting in a logic high voltage on the DATA node 44 and a logic low voltage on the DATA# node 48. After stable values have been achieved on the complementary data nodes 44, 48, the latch 34 is enabled and the data bit is latched to the first and second complementary output terminals 52, 54 (OUT, OUT#).

Figure 3:
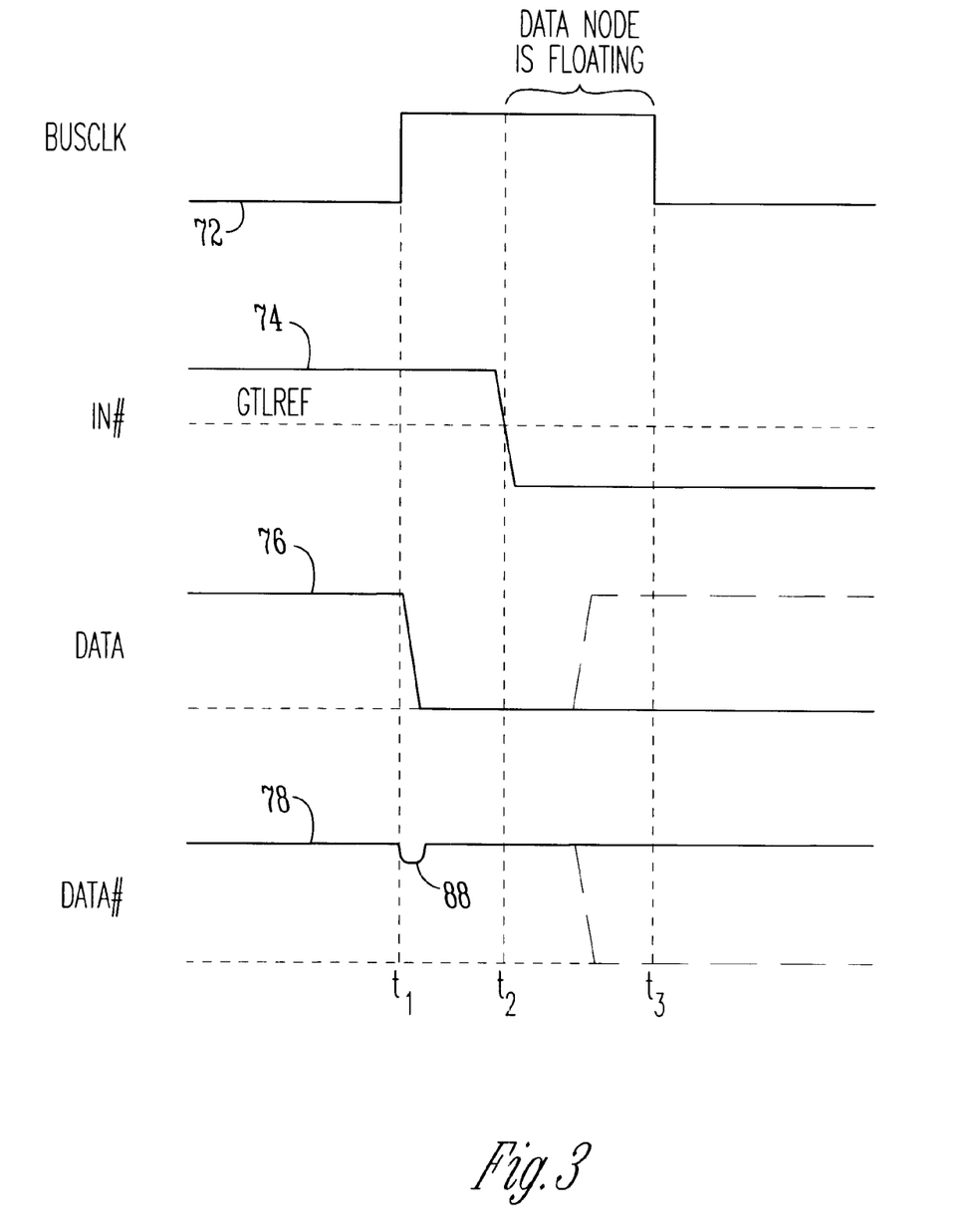
FIG. 3 is a timing diagram illustrating the operation of the clocked sense amplifier flip flop of FIG. 2.

When operating in a noisy environment, the clocked sense amplifier flip flop 30 of FIG. 2 can be susceptible to error under certain operating conditions. For example, at least one situation can occur where one of the complementary data nodes 44, 48 is floating during operation (i.e., there is no current path leading away from the node). When such a floating node condition exists, random noise from the surrounding environment can induce a charge onto the floating node that can cause an undesired switch in the state of the device. FIG. 3 is a timing diagram illustrating this scenario. As shown, the timing diagram of FIG. 3 includes a BUSCLK waveform 72 representing the clock signal, an IN# waveform 74 representing the input data waveform, and DATA and DATA# waveforms 76, 78 representing the signals on the complementary data nodes 44, 48. At time t1, the BUSCLK signal 72 transitions from a low value to a high value. Previous to this time, the IN# signal 74 has achieved a logic high value representative of a present input data bit. Because the input data bit is high at t1, the DATA signal 76 discharges to a logic low value after t1, as described previously. As shown, there is also a small dip 88 in the DATA# waveform 78 due to the initial discharging of DATA# node 48, but the DATA# waveform 78 eventually returns to a logic high value.

Sometimes, the next input data transition on a bus can occur early (e.g., before a present clock pulse has ended). This is illustrated in FIG. 3 by the IN# waveform 74 transitioning to a logic low value at time t2. If this occurs, the input transistor 66 is turned off. The first PMOS transistor 56 is already off at this point due to the logic high value on the gate of the device. Thus, there is no current path leading away from the DATA node 44 and the node is floating for the remainder of the clock pulse (from t2 to t3 in FIG. 3). During this floating period, noise can induce charge onto the DATA node 44 that raises the voltage of the node 44. This increased voltage may be great enough to switch the present state of the sense amp 32 (e.g., by turning off PMOS transistor 58 and turning on NMOS transistor 62). Such an occurrence is illustrated in the DATA and DATA# waveforms 76, 78 of FIG. 3 using dotted lines. When the latch 34 is subsequently enabled, an incorrect data value is latched to the output terminals 52, 54. As can be appreciated, it is desirable that such errors be avoided.

Figure 4:
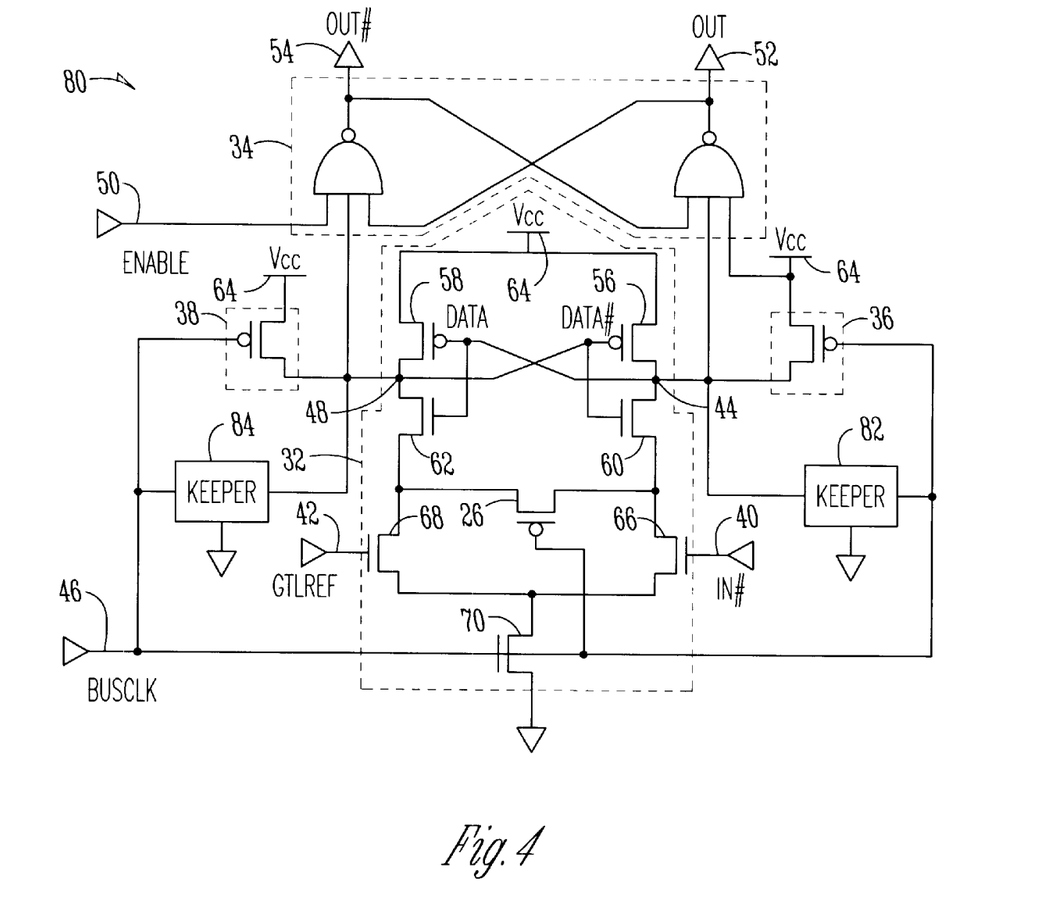
FIG. 4 is a schematic diagram illustrating a clocked sense amplifier flip flop that can prevent the occurrence of a floating data node in accordance with one embodiment of the present invention.

FIG. 4 is a schematic diagram illustrating a clocked sense amplifier flip flop 80 that can prevent the occurrence of a floating data node in accordance with one embodiment of the present invention. As illustrated, a keeper unit 82 is coupled to the DATA node 44 to ensure that the node 44 maintains an appropriate voltage value throughout the corresponding clock pulse. The keeper unit 82 does this by ensuring that once a logic low value is achieved on the DATA node 44 after the start of the clock pulse (e.g., after t1 in FIG. 3), a current flow path from the DATA node 44 to ground is maintained for the reminder of the clock pulse (i.e., the DATA node 44 never floats).

As illustrated, a second keeper unit 84 is coupled to the DATA# node 48 for sense amplifier matching purposes (i.e., to maintain a relatively balanced condition in the circuit). The second keeper unit 84 will preferably have the same impedance characteristics as the first keeper unit 82. In one embodiment, substantially identical first and second keeper units 82, 84 are used.

Figure 5:
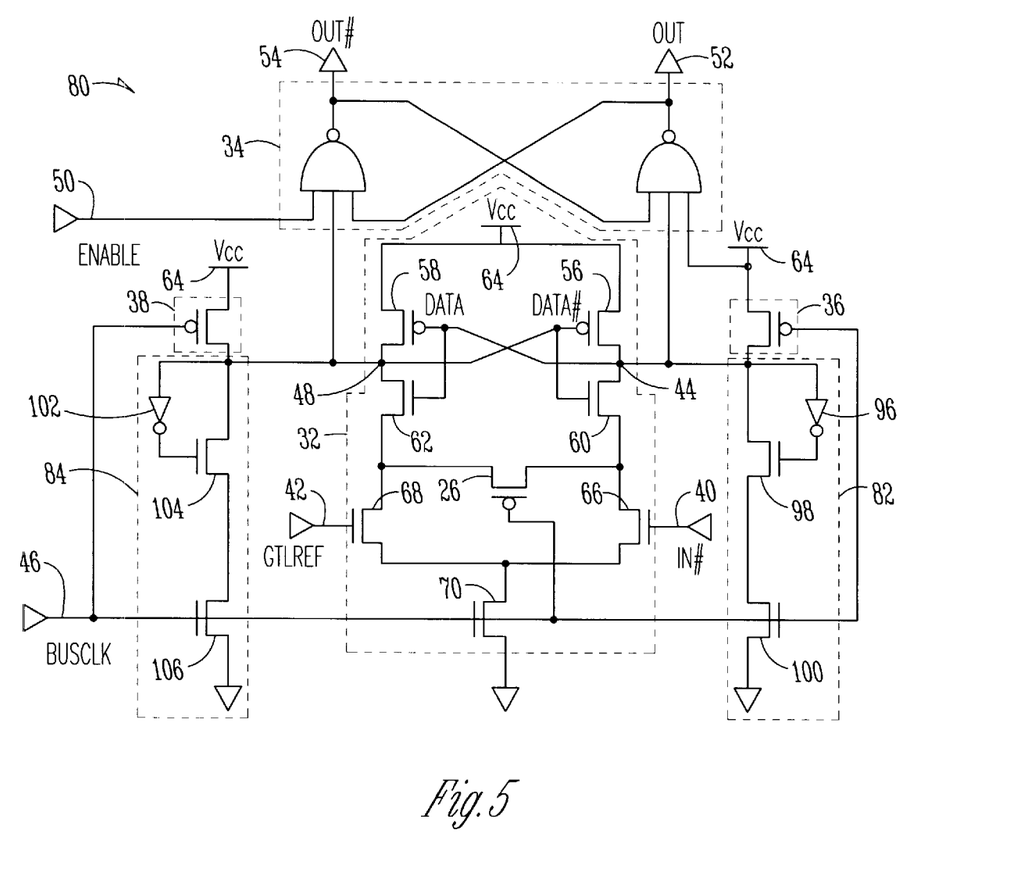
FIG. 5 is a schematic diagram illustrating one possible implementation of the clocked sense amplifier flip flop of FIG. 4.

FIG. 5 is a schematic diagram illustrating one possible implementation of the clocked sense amplifier flip flop 80 of FIG. 4. As illustrated, the first keeper unit 82 includes an inverter 96, a keeper transistor 98, and a ground transistor 100. The second keeper unit 94, which is substantially the same as the first, includes an inverter 102, a keeper transistor 104, and a ground transistor 106. The keeper transistor 98 and the ground transistor 100 of the first keeper unit 92 are NMOS transistors that are connected in series between the DATA node 44 and ground. The inverter 96 has an input connected to the DATA node 44 and an output connected to the gate terminal of the keeper transistor 98. The gate terminal of the ground transistor 100 receives the BUSCLK signal. Therefore, the ground transistor 100 is on during each clock pulse and off at other times.

When the DATA node 44 is fully charged (e.g., during the precharge period), the output of the inverter 96 is logic low and the keeper transistor 98 is off. The keeper unit 92 has little effect on the sense amplifier circuit at this time. If the DATA node 44 subsequently drops to a logic low value in response to the next rising clock edge (e.g., when the signal on the data input 40 is logic high), the output of the inverter 96 transitions to logic high and the keeper transistor 98 is turned on. As described above, the ground transistor 100 is also on at this time and the DATA node 44 is thus coupled to ground. Therefore, even if the input signal at data input 40 subsequently transitions to a logic low value before the end of the clock pulse (e.g., before t3 in FIG. 3), the DATA node 44 will not float because a current path to ground exists. Consequently, there can be no build up of noise charge on the DATA node 44 and an undesired data shift will not occur. If the DATA node 44 remains logic high after the rising edge of the clock pulse, the keeper transistor 98 remains off during the entire clock pulse. As the reader will understand, many alternative keeper arrangements can also be implemented in accordance with the present invention. It should be appreciated that the circuit arrangements of FIGS. 4 and 5 can be used in any application requiring a clocked sense amplifier flip flop and are not limited to use within bus receivers.

Although the present invention has been described in conjunction with certain embodiments, it is to be understood that modifications and variations may be resorted to without departing from the spirit and scope of the invention as those skilled in the art readily understand. For example, in the embodiments described above, metal-oxide-semiconductor (MOS) transistors have been used. It should be appreciated that other types of transistor, including other forms of insulated gate field effect transistor, can alternatively be used. Such modifications and variations are considered to be within the purview and scope of the invention and the appended claims.

What is claimed is:

1. A clocked sense amplifier flip flop comprising:

first and second dynamic data nodes;

first and second precharge devices to precharge said first and second dynamic data nodes, respectively, during a first portion of a clock signal;

a sense amplifier to discharge one of said first and second dynamic data nodes during a second portion of said clock signal based on a data signal at an input of said sense amplifier;

a latch to latch a data bit from said first and second dynamic data nodes into an internal storage location of said latch in response to a control signal; and a keeper unit coupled to said first dynamic data node to maintain a low voltage level on said first dynamic data node for a remainder of said second portion of said clock signal when said first dynamic data node is discharged by said sense amplifier regardless of changes in said data signal during said remainder of said second portion of said clock signal.

2. The clocked sense amplifier flip flop of claim 1, wherein:
said keeper unit includes at least one switch to provide a low impedance discharge path from said first dynamic data node when a logic low value is present on said first dynamic data node.

3. The clocked sense amplifier flip flop of claim 1, wherein:
said keeper unit includes a keeper transistor and a ground transistor connected in series between said first dynamic data node and ground, said keeper transistor to provide a low impedance connection between said first dynamic data node and said ground transistor when a logic low voltage value is present on said first dynamic data node and a high impedance connection between said first dynamic data node and said ground transistor when a logic high voltage value is present on said first dynamic data node.

4. The clocked sense amplifier flip flop of claim 3, wherein:
said ground transistor provides a low impedance connection between said keeper transistor and ground during said second portion of said clock signal and a high impedance connection between said keeper transistor and ground during said first portion of said clock signal.

5. The clocked sense amplifier flip flop of claim 3, wherein:
said keeper unit includes an inverter connected between said first dynamic data node and an input terminal of said keeper transistor.

6. The clocked sense amplifier flip flop of claim 1, wherein:
said clock signal alternates between a logic low value and a logic high value, wherein said first portion of said clock signal is a logic low portion and said second portion of said clock signal is a logic high portion.

7. The clocked sense amplifier flip flop of claim 1, comprising:
a second keeper unit coupled to said second dynamic data node.

8. The clocked sense amplifier flip flop of claim 7, wherein:
said second keeper unit is substantially identical to said first keeper unit.

9. A clocked sense amplifier flip flop comprising:
first and second dynamic data nodes;
first and second precharge devices to precharge said first and second dynamic data nodes during a first portion of a clock signal;
a sense amplifier to discharge one of said first and second dynamic data nodes during a second portion of said clock signal based on a data signal at an input of said sense amplifier;
a latch to latch a data bit from said first and second dynamic data nodes into an internal storage location of said latch in response to a control signal; and
a keeper switch to provide a low impedance path from said first dynamic data node to ground for a remainder of said second portion of said clock signal in response to a discharge of said first dynamic data node by said sense amplifier during said second portion of said clock signal, wherein said keeper switch is separate from said sense amplifier.

10. The clocked sense amplifier flip flop of claim 9, wherein:
said clock signal alternates between a logic low value and a logic high value, wherein said first portion of said clock signal is a logic low portion and said second portion of said clock signal is a logic high portion.

11. The clocked sense amplifier flip flop of claim 9, wherein:
said keeper switch includes a keeper transistor and a ground transistor connected in series between said first dynamic data node and ground, said keeper transistor to provide a low impedance connection between said first dynamic data node and said ground transistor when a logic low voltage level is present on said first dynamic data node and a high impedance connection between said first dynamic data node and said ground transistor when a logic high voltage level is present on said first dynamic data node.

12. The clocked sense amplifier flip flop of claim 11, wherein:
said ground transistor provides a low impedance connection between said keeper transistor and ground during said second portion of said clock signal and a high impedance connection between said keeper transistor and ground during said first portion of said clock signal.

13. The clocked sense amplifier flip flop of claim 11, wherein:
said keeper switch includes an inverter connected between said first dynamic data node and an input terminal of said keeper transistor.

14. The clocked sense amplifier flip flop of claim 9, comprising:
a second keeper switch coupled to said second dynamic data node that is substantially identical to said first keeper switch.

15. A computer system comprising:
a first functional unit;
a second functional unit;
a transmission medium to provide data communication between said first functional unit and said second functional unit;
a driver associated with said first functional unit to transmit data onto said transmission medium for delivery to said second functional unit; and
a receiver associated with said second functional unit to receive said data from said transmission medium, said receiver including a clocked sense amplifier flip flop comprising:
first and second dynamic data nodes;
first and second precharge devices to precharge said first and second dynamic data nodes, respectively, during a first portion of a clock signal;
a sense amplifier to discharge one of said first and second dynamic data nodes during a second portion of said clock signal based on a data signal received from said transmission medium;
a latch to latch a data bit from said first and second dynamic data nodes into an internal storage location in response to a control signal; and
a keeper unit coupled to said first dynamic data node to maintain a low voltage level on said first dynamic data node for a remainder of said second portion of said clock signal when said first dynamic data node is discharged by said sense amplifier regardless of changes in said data signal at said input of said sense amplifier during said remainder of said second portion of said clock signal.

16. The computer system claimed in claim 15, wherein: said first functional unit is a digital processor.

17. The computer system claimed in claim 15, wherein: said second functional unit is a chip set.

18. The computer system claimed in claim 15, wherein: said transmission medium is part of a computer bus.

19. The computer system claimed in claim 15, wherein: said clock signal alternates between a logic low value and a logic high value, wherein said first portion of said clock signal is a logic low portion and said second portion of said clock signal is a logic high portion.

20. The computer system claimed in claim 15, comprising:
a second keeper unit coupled to said second dynamic data node that is substantially identical to said first keeper unit.

* * * * *